United States Patent
Siebert et al.

(10) Patent No.: US 8,444,126 B2
(45) Date of Patent: May 21, 2013

(54) HOLDING AND TURNING DEVICE FOR TOUCH-SENSITIVE FLAT OBJECTS

(75) Inventors: Sönke Siebert, Heidelberg (DE); Dietrich Drews, Selzen (DE); Holger Wenz, Ludwigshafen (DE)

(73) Assignee: Rudolph Technologies Germany GmbH, Mainz (DE)

( * ) Notice: Subject to any disclaimer, the term of this patent is extended or adjusted under 35 U.S.C. 154(b) by 959 days.

(21) Appl. No.: 12/311,371

(22) PCT Filed: Sep. 28, 2007

(86) PCT No.: PCT/EP2007/060302
§ 371 (c)(1),
(2), (4) Date: Aug. 5, 2009

(87) PCT Pub. No.: WO2008/037791
PCT Pub. Date: Apr. 3, 2008

(65) Prior Publication Data
US 2010/0001449 A1    Jan. 7, 2010

(30) Foreign Application Priority Data

Sep. 28, 2006    (DE) .......................... 10 2006 045 866

(51) Int. Cl.
*B25B 11/00*    (2006.01)
(52) U.S. Cl.
USPC .............................. 269/21; 269/903; 294/1.1
(58) Field of Classification Search
USPC .. 269/21, 20, 55, 60, 48.1, 900, 903; 294/1.1; 279/106, 1
See application file for complete search history.

(56) References Cited

U.S. PATENT DOCUMENTS

| | | | |
|---|---|---|---|
| 3,523,706 A | 8/1970 | Logue | |
| 6,184,972 B1 * | 2/2001 | Mizutani et al. | 355/72 |
| 6,280,308 B1 * | 8/2001 | Ishikawa et al. | 451/388 |
| 6,559,938 B1 | 5/2003 | Smedt | |
| 6,702,302 B2 | 3/2004 | Smedt et al. | |
| 7,055,535 B2 * | 6/2006 | Kunisawa et al. | 134/157 |
| 7,284,760 B2 * | 10/2007 | Siebert et al. | 279/4.12 |
| 2004/0070221 A1 | 4/2004 | Hoehn et al. | |
| 2010/0001449 A1 * | 1/2010 | Siebert et al. | 269/21 |

FOREIGN PATENT DOCUMENTS

| | | |
|---|---|---|
| DE | 102 37 477 A1 | 11/2003 |
| DE | 20 2004 011 907 U1 | 1/2005 |
| DE | 10 2004 036 438 A1 | 11/2005 |
| DE | 10 2005 000 665 A1 | 7/2006 |
| WO | WO 96/35227 A1 | 11/1996 |

(Continued)

*Primary Examiner* — Lee D Wilson
(74) *Attorney, Agent, or Firm* — Hudak, Shunk & Farine Co. LPA (57) ABSTRACT

A holding/turning device for touch-sensitive flat objects, in particular wafers, with a distance positioning device which is arranged for holding the object perpendicular to the object plane at a defined distance, a lateral positioning device, arranged for positioning the object in the object plane and for rotating together with the object about a rotational axis perpendicular to the object plane, and with a rotational drive, coupled with the lateral positioning device, providing a driving force for rotating the object about the rotational axis, wherein the driving force can be applied to the object by the lateral positioning device. The distance positioning device is adapted for holding the object without involving contact, and is decoupled from the rotational drive in such a way that the distance positioning device does not rotate together with the object.

19 Claims, 5 Drawing Sheets

FOREIGN PATENT DOCUMENTS

| WO | WO 00/61474 A1 | 10/2000 |
| WO | WO 03/060961 A1 | 7/2003 |
| WO | WO 03/088324 A2 | 10/2003 |
| WO | WO 2006/072422 A1 | 7/2006 |

* cited by examiner

HOLDING AND TURNING DEVICE FOR TOUCH-SENSITIVE FLAT OBJECTS

FIELD OF THE INVENTION

The invention concerns a holding and turning device for touch-sensitive objects, in particular, wafers, with a distance positioning device which is arranged for holding the object perpendicular to the object plane at a defined distance, a lateral positioning device, arranged for positioning the object in the object plane and for rotating together with the object about a rotational axis perpendicular to the object plane, and with a rotational drive, coupled with the lateral positioning device, providing a driving force for rotating the object about the rotational axis, wherein the driving force can be applied to the object by means of the lateral positioning device.

BACKGROUND OF THE INVENTION

Wafers are automatically moved by robots both in the fabrication and during the process inspection. Some fabrication and process steps require the rotation of the wafers about their own axis. One example is the inspection of the wafers for contamination and damage by means of optical methods, such as are described in DE 102 37 477 B4. The optical measuring system has a scattered light inspection device with which the surface of the rapidly rotating wafer is scanned in spiral fashion by a laser. The above-mentioned holding device is used in order to hold the wafer and place it in rotation.

Caution in the design of such a holding system is always mandated in terms of a possible contamination. Also for this reason one must avoid any contact with the wafer surface. This applies in particular to the holding device, which if possible should not touch the wafer either on the front side or the back side. In modern semiconductor fabrication, what is more, there is an increasing interest in also inspecting the back side of the wafer, which must therefore be freely accessible there by means of a measurement system. The systems proposed for this purpose are based on various principles, as will become evident from the following discussion of the prior art in detail. Moreover, rapid rotations of several thousand revolutions per minute are desirable. It is important that the wafer run in as plane and circular a manner as possible. A deformation or vibration of the wafer would result in an impairment of the measurement result in the optical sensing method. The holding device should satisfy all these requirements.

U.S. Pat. No. 6,559,938 B1 discloses a holding device which uses a cushion of air, i.e., a fluid flow, for the distance positioning of the wafer above a table. The torque for the rotation is introduced by several driven frictional rollers arranged along a peripheral segment of the wafer, after the table with the inserted wafer has been tilted from the horizontal so that it comes to lie on the frictional rollers. Since no edge gripper is used here, the wafer is quite freely accessible from the front side and the back side, so that basically a simultaneous inspection of both sides is possible. The problem here is that pressing force is limited by the gravity acting on the wafer and therefore large torques cannot be applied. Thus, this type of drive does not provide an adequate rotational velocity. Another problem can be abrasion caused by the direct contact between the moving frictional rollers and the edge of the wafer. Furthermore, in this technique, very high demands are placed on the precision of the device, due to a recess (notch) formed at the edge of the wafer, in order to ensure both an excellent concentric running and a uniform application of torque. For the aforementioned reasons, the invention starts with a different drive principle.

One example of a holding device of this kind is shown in DE-OS 10 2004 036 435 A1. This has a mechanical edge gripper, which supports the wafer largely free of contamination. However, in this process it touches the wafer front side and the wafer back side in its edge region. Furthermore, this holding device can only be used in a narrow range of rpm, because an air pressure gradient is formed above a turntable of the holding device, due to the centrifugal force, and it can warp the wafer.

A holding device is known from U.S. Pat. No. 6,702,302 B2, in which a gas feed is used to adjust pressure conditions in a turntable to ensure a planar support for the wafer. The wafer is fixed in the region of its edges by grippers attached to the table and able to move in the radial direction, and the torque for the rotation of the wafer is also produced by them.

A holding device is known from DE-OS 10 2005 000 665 A1 that likewise uses a cushion of air or gas to hold the wafer at a definite distance in the direction perpendicular to its primary dimensional plane. Moreover, the holding device has nozzles acting at a slant to its plane, producing a force component acting parallel to this plane and fixing the wafer in the radial direction with the help of passive stops. The wafer is placed in rotation by form fit, thanks to a driver engaging with the notch at the edge of the wafer.

Although the last mentioned holders are suitable for high rotational velocities and sometimes also offer an adequate plane running, only one side of the wafer can be inspected, namely, the one opposite the edge grippers, and the wafer has to be turned over to inspect the other side (back side).

A transport device is known from WO 03/060961 A1 for the non-contact supporting and non-contact transport of flat objects, which create a cushion of air by means of openings made in a table forming vent nozzles on the one hand and suction nozzles on the other, which can be adjusted very specifically and which can be used to achieve a uniform supporting and/or a transport of the flat object. In theory, an overhead support is also possible with this, so that the wafer does not need to be turned over, but instead the support system can be brought up from the other side of the wafer.

Moreover, a holding device for the non-contact positioning of flat objects is known from WO 00/61474, which produces levitation sound waves that define a holding plane, in which the object can be suspended, by means of selected energy nodal points.

The aforementioned prior art is not and cannot be associated with a rotational drive in some respects, and in others can only be so associated with great expense. In particular, the distance positioning devices which work by means of fluid flow have the drawback that the supply and drain lines for the fluid require a large construction expense and constitute large moving masses. Such holding devices are therefore unsuited in particular for compact inspection gear that can be integrated into process machinery. Furthermore, they have the drawback that access to the back side of the wafer for scattered light inspection is difficult owing to their construction.

Accordingly, the problem of the present invention is to provide an especially compact holding device with which a flat object, especially a wafer, can be supported with minimal contamination of both sides of the wafer, at high rpm and with planar running of a few thousandths of a millimeter, so that the greatest possible access exists to its front and back side. Furthermore, the holding device should be able to work overhead, so that the wafer can be supported from above and from below and be inspected without having to turn it over.

The problem is solved according to the invention by a holding device with a distance positioning device which is arranged for holding the object perpendicular to the object plane at a defined distance, a lateral positioning device, arranged for positioning the object in the object plane and for rotating together with the object about a rotational axis perpendicular to the object plane, and with a rotational drive, coupled with the lateral positioning device, providing a driving force for rotating the object about the rotational axis, wherein the driving force can be applied to the object by means of the lateral positioning device, wherein the lateral positioning device does not make contact with the object at either its top side or bottom side and the distance positioning device has means for holding the object without involving contact, and is decoupled from the rotational drive in such a way that the distance positioning device does not rotate together with the object. Advantageous modifications are contained in the subclaims.

The invention specifies, in a holding device of the kind mentioned in the introduction, that the lateral positioning device does not make contact with the object at either its top side or bottom side and the distance positioning device has means for holding the object without involving contact, and is decoupled from the rotational drive in such a way that the distance positioning device does not rotate together with the object.

In this way, the rotating part, namely, the lateral positioning device along with the rotational drive, can be simple in design and the moving masses can be kept low. The distance positioning device is stationary relative to it and thus can be adapted with allowance for the aerodynamical conditions quite easily to the available space, especially in consideration of the space needed for the scattered light inspection. Because the lateral positioning device does not touch the object either on its top side or its bottom side, but only in its marginal region, and because the distance positioning device has means for holding the object without involving contact, the danger of contamination of the top and bottom side of the object or wafer is minimized. The object does not have to lie by its flat surfaces on or against a part of the holding device either to ensure the desired distance or for lateral positioning or applying of a driving force.

Preferably, the distance positioning device has a nozzle arrangement, which is designed to create a fluid flow directed essentially perpendicular to the surfaces, which is used to support the object at a defined distance.

Such familiar "Bernoulli chucks" in a stationary arrangement, however, open up the prospect of a simple fluid feeding without the familiar expensive rotary transmission feedthroughs, which additionally increase the moving masses and are critical in regard to maintaining air purity. A fluid flow directed essentially perpendicular onto the surface means that the sum of all fluid flows (when there are several nozzles in the layout) produces no significant lateral force component. Accordingly, only a force which is perpendicular to the surface remains in the sum.

In an alternative advantageous modification, the distance positioning device has sound generating means, which are designed to produce levitating sonic waves.

Such distance positioning devices are also familiar, as mentioned in the introduction, but only for use in technological processes in which horizontal and vertical transporting, warehousing, or temporary storing is required. The use in connection with a rotation, especially for the inspection of the object, is not known. The benefits of this kind of distance positioning lie in a lower consumption of air and energy and consequently easier keeping clean of the air.

In another advantageous configuration, the distance positioning device has evacuation means that are designed to create a local partial vacuum and that interact with the nozzle arrangement or sound generating means to hold the object at the defined distance.

It has been found, especially in comparison to a nozzle arrangement with no evacuation means, that the evacuation means make it possible to lower the volume flow of fluid as well as its flow velocity, which lessens the danger of contamination. In combination with the sound generating means, the additional evacuation means have proven to be beneficial, since such a device is suitable for overhead supporting of the object and distance positioning, so that the wafer's back side can be inspected without having to turn the wafer over.

The distance positioning device according to one advantageous modification has an essentially flat table, in which the nozzle arrangement, the sound generating means, and/or the evacuation means are arranged so that the object is held at the defined distance parallel to the table.

In one advantageous modification, the table has an opening for an optical measurement system to have access to the object.

Since the distance positioning device and thus the table are arranged stationary, the optical measurement system can thus be brought up to the required distance, say, from the bottom through the opening, in order to sense the surface of the object. The opening can be in the form of a through hole, for example, or in the form of a gap dividing the table into two halves, but each time one must make sure that the aerodynamical conditions between the table and the object assure the required distance positioning.

In one advantageous embodiment, the lateral positioning device is designed to apply the driving force to the object by means of a frictional connection. In another embodiment, it can be advantageous for the lateral positioning device to be designed to apply the driving force to the object by means of positive locking.

Especially preferably, the lateral positioning device has deflection means which are designed to permit a deflection movement of the object in the distance direction.

This is advantageous, because otherwise the holding device is mechanically over-determined with respect to the holding force in the distance direction, i.e., perpendicular to the object plane, so that if the axis of rotation is not oriented perfectly perpendicular to the object plane alternating forces may attack the object and can cause it to vibrate or produce particles by abrasion.

The deflection means preferably have spring elements assigned to each of the stop element, edge gripper and/or driver and acting in the distance direction.

In another advantageous modification, for the same reason the lateral positioning device is designed to exert practically no holding force on the object in the distance direction.

The lateral positioning device and the distance positioning device can be arranged on the same side of the object plane. This design is more simple in construction. The lateral positioning device and the distance positioning device can be arranged on the opposite side of the object plane, however, for example, for design-related requirements.

BRIEF DESCRIPTION OF THE DRAWINGS

Further problems, features and benefits shall be explained more closely below by means of sample embodiments by means of the drawings. These show.

DETAILED DESCRIPTION OF THE INVENTION

Figure 1:
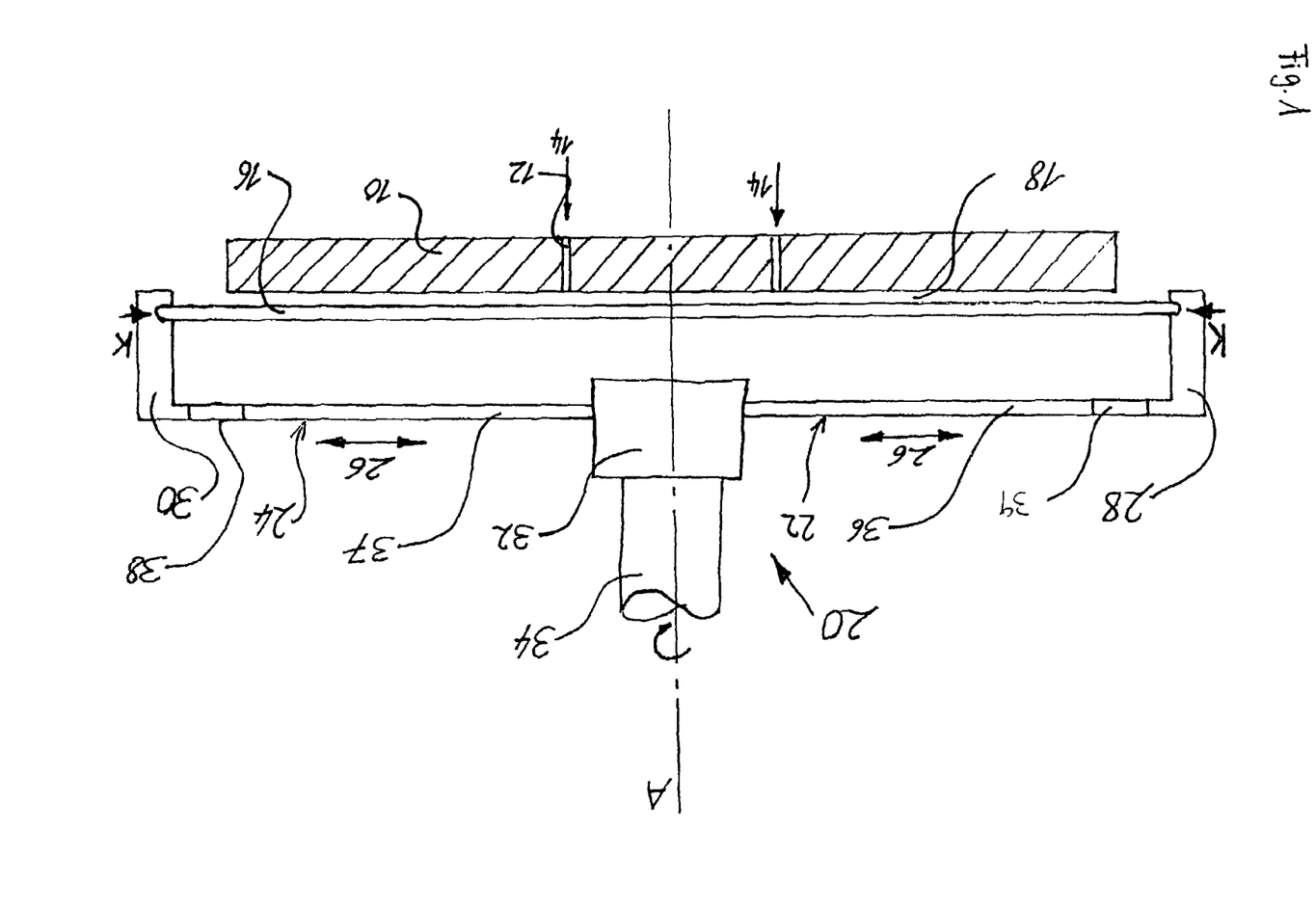
FIGS. 1 and 1A: a holding device of the invention in a first embodiment with three edge grippers as active lateral positioning elements in side view, and also an enlarged cutout.

The holding device per FIG. 1 is shown partly in side view and partly in cross section. It has on its bottom side a distance positioning device in the form of a table 10 with an annular arrangement of several nozzles 12. The nozzles 12 are essentially formed by continuous bores through the table 10, which (as shown) can be arranged vertically or also at a slant to the plane of the table. The fluid flow created in this way (indicated by arrows 14) is accordingly oriented basically vertical, or possibly slanted, relative to the plane of a wafer 16 being held at a defined distance above the table; in addition, a lateral force can be exerted on the wafer by a slanted fluid flow.

At the top side of the wafer 16 there is a lateral positioning device 20. This has three edge grippers 22, 24 arranged in the form of a spoked star with spoke segments 36, 37 running parallel to the wafer plane, only two of them being shown for simplicity. The edge grippers 22, 24 can move back and forth in essentially linear fashion, parallel to the plane of the wafer 16, between a fixation and a releasing of the wafer (indicated by double arrows 26). The edge grippers 22, 24 grab the wafer 16 in its edge region by a bent segment 28 or 30 and apply a clamping force K acting parallel to the plane of the wafer. All edge grippers can move back and forth between the fixation and the releasing in synchronized fashion by means of a common activation mechanism for the movement and creation of the clamping force. The common activating mechanism is arranged in a central housing 32. Such activating mechanisms are quite well known. As a rule, they have a pre-stressing element (spring), by means of which the clamping force K is created, and an activating element, with which the edge grippers are moved against the clamping force K into the release position.

Alternatively to the linear-movable edge grippers 26 of FIG. 1, one can also use, for example, edge grippers which are hinged to the ends of basically rigid arms and swivel back and forth between the fixation position at the edge of the wafer and a release position. One such mechanism is known in principle from DE-OS 10 2004 036 435 A1, for example.

The edge grippers 22, 24 per FIG. 1 are turned in rotation about the axis of rotation A by means of a rotational drive 34. The wafer 16 is carried along by friction via the bent-down segments 28, 30 of the edge grippers lying against the edge of the wafer 16. Thus, the edge grippers 22, 24 are engaged with the least possible clamping force K in the object plane and touch neither the top side nor the bottom side of the wafer 16.

However, the clamping force K must be sufficient to assure a frictional entrainment as the rotational drive 34 speeds up and slows down. On the other hand, since the distance positioning occurs via the arrangement of nozzles 12 and the pressure relations in the gap 18 between the table 10 and the wafer 16, the edge grippers 22, 24 must have no holding force in this direction if possible, so that the wafer is not subjected to any stress in the event that the rotational axis A is not positioned exactly vertical to the plane of the wafer.

Figure 1A:
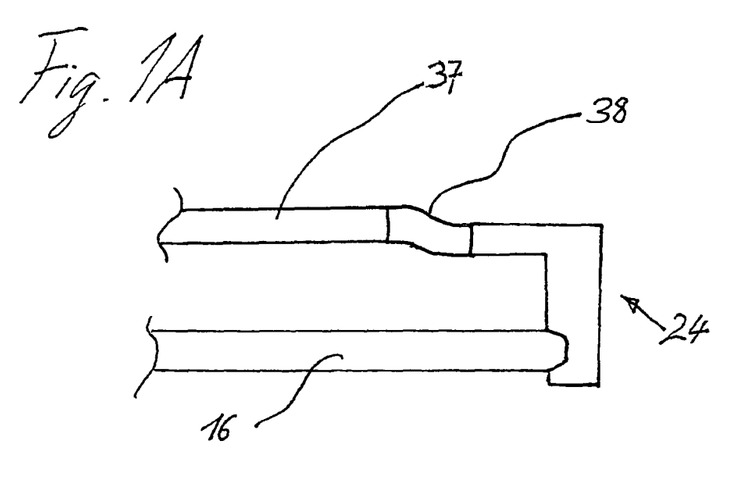

For this purpose, the edge grippers 22, 24 have deflection means in the region of their spoke segments 36, 37 in the form of spiral spring elements 38, 39, as can be recognized from the enlarged cutout view of FIG. 1A. These could be fashioned, for example, in the form of attached spring steel sheets or molded-on solid-body hinges. The spring elements 38, 39 work exclusively in the distance direction and are rigid in all other directions, so that the edge gripper and, with it, the wafer can yield in the distance direction during the rotation, but a frictional entrainment is ensured for the whole time.

Figure 2:
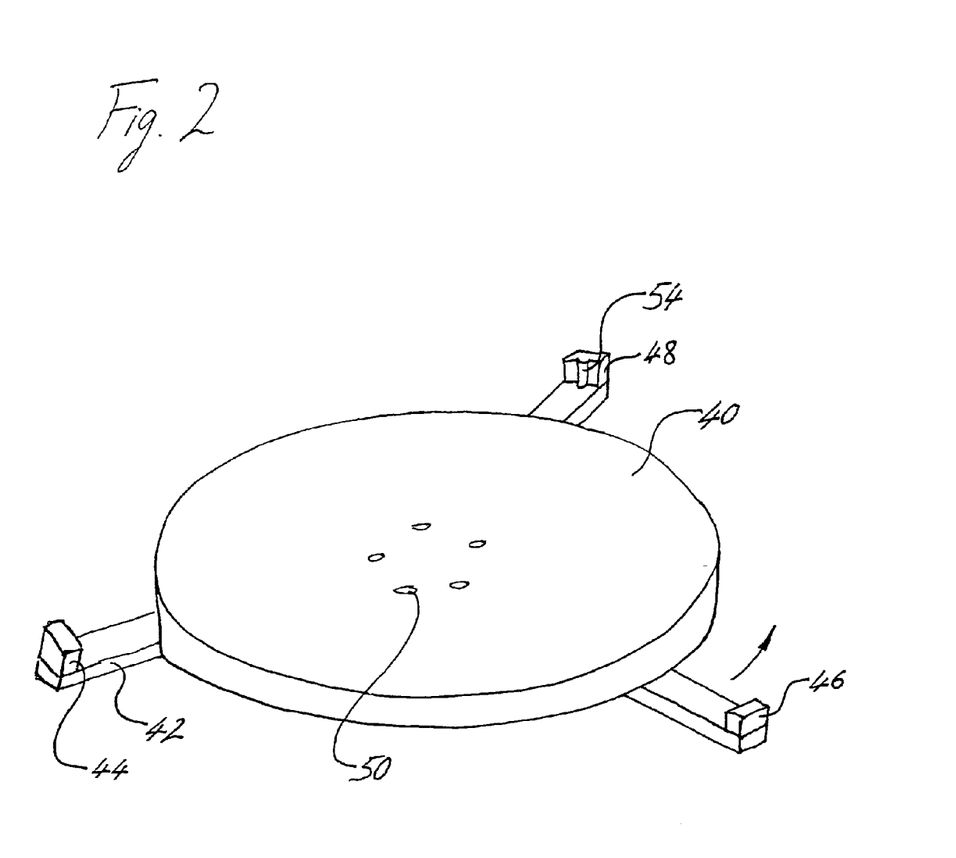
FIG. 2: a holding device in a second embodiment with purely passive lateral positioning elements in perspective view.

FIG. 2 shows an embodiment of the invented holding device in which the distance positioning device and the lateral positioning device are arranged on the same side of the object plane. The distance positioning device has a round, flat table 40 with an arrangement of several nozzles 50, through which the fluid flow, aimed essentially vertically onto the object plane, emerges and holds the object (not shown) at a defined distance. Moreover, a fluid feed system (not shown) is located on the bottom side of the table 40.

The lateral positioning device has three stop elements 44, 46 and 48, which are fixed immovably relative to each other at the ends of a common spoke star 42. The stop element 48 has a projection 54 at its radially inward side. The projection is designed so as to engage with a corresponding recess (notch) in the edge of the wafer and serves as a driver for the positive-locking application of drive force. The drive force is transmitted by a rotational drive (not shown) to the spoke star 42 of the lateral positioning device and, from this, to the stop elements 44, 46 and 48.

Since the stop elements are arranged stationary in the object plane, their arrangement must fit as accurately as possible the diameter of the object being held. Accordingly, this is a passive lateral positioning device. Together with the projection 54, the stop elements 44, 46 and 48 define the position of the object in the object plane, not only laterally, but also in regard to its angular position, thanks to the positive locking.

Figure 3:
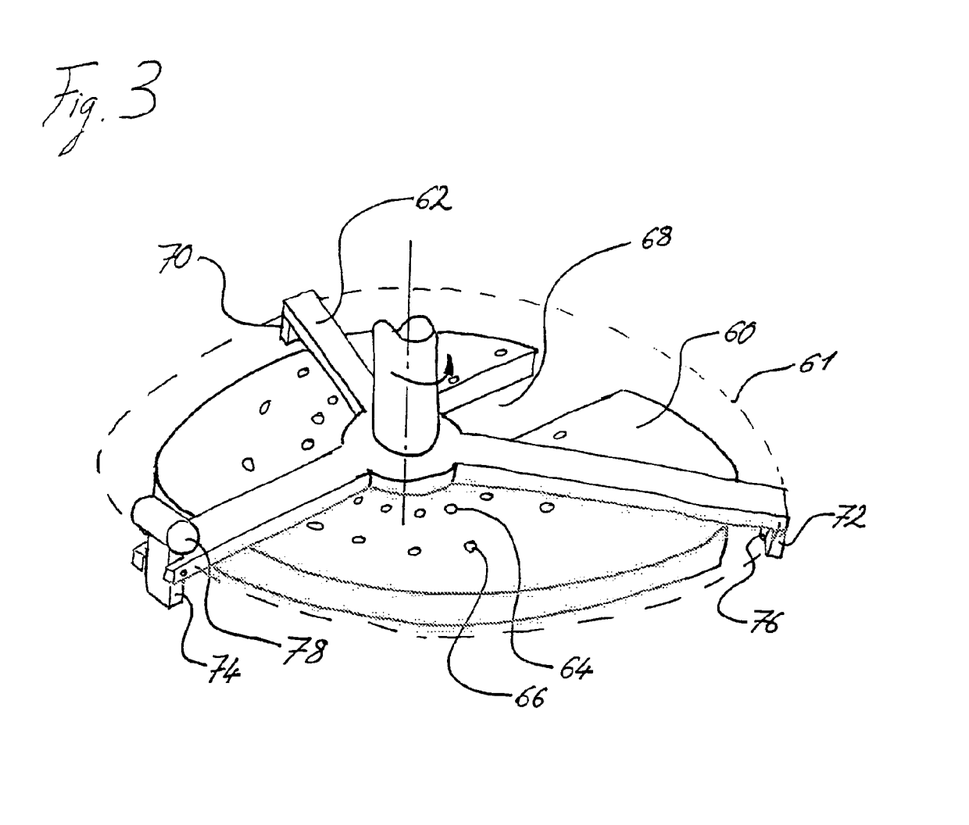
FIG. 3: a holding device in a third embodiment with passive and active lateral positioning elements in perspective view.

The holding device per FIG. 3 matches the design of the holding device of FIG. 2, inasmuch as the distance positioning device has a round, flat table 60 with an arrangement of several nozzles 64 and the lateral positioning device has the shape of a spoke star 62. But this time the two devices are located on opposite sides of the object (wafer 61), indicated by dotted line. Besides the arrangement of nozzles 64, which are arranged in the shape of an inner circle and produce a distance-holding flow directed essentially vertically onto the surface of the object, the table also has an arrangement of additional nozzles (suction nozzles) 66 on an outer circle, which are connected from the bottom side of the table 60 to a vacuum pump and form with it evacuation means producing a local reduced pressure in the space between the table 60 and an object (not shown). The reduced pressure interacts with the fluid flow such that the object is held at the defined distance and can also be supported overhead.

The table, moreover, has an opening 68 in the shape of a through hole made in one side of the table, providing access for an optical measuring system to inspect the object from the bottom side. The through hole extends to the middle of the table, so that a complete inspection of the surface of the object is made possible.

Once again, three stop elements 70, 72, 74 are arranged on the spoke star 62, which is brought up from above. The two stop elements 70, 72 are radially fixed in place, i.e., in the plane of the object. The stop element 72, again, has a projection 76 for positive-locking engagement with a corresponding recess at the edge of the object. The third stop element 74 is not fixed in place, but instead can swivel on the respective arm of the spoke star 62. The stop element 74 is arranged so that it has a slight distance (play) from the edge of the object at standstill, for loading of the holding device. Moreover, the stop element 74 has a centrifugal weight 78 above its swivel axis, which during operation is accelerated outward thanks to the rotation of the spoke star 62 and presses the lower end of the stop element 74 against the edge of the object 61 and thus eliminates the loading play. In addition to the passive centrifugal weight, the stop element 74 usually also has an active adjusting device, which provides for an adequate centering of the wafer already during the startup phase, since the centrifugal force acting on the weight is not yet enough at low rotational speed. The adjusting device and its corresponding control system are not shown in FIG. 3.

Even though the stop element 74 is not fixed in place relative to the object plane, the object is entrained by positive locking and the lateral positioning device is not active, since the stop element does not apply any clamping force for the frictional entrainment of the object—and therefore also exerts basically no holding force on the object 61 in the distance direction, but merely assures a defined lateral position, as well as the positive locking with the projection 76.

Figure 4:
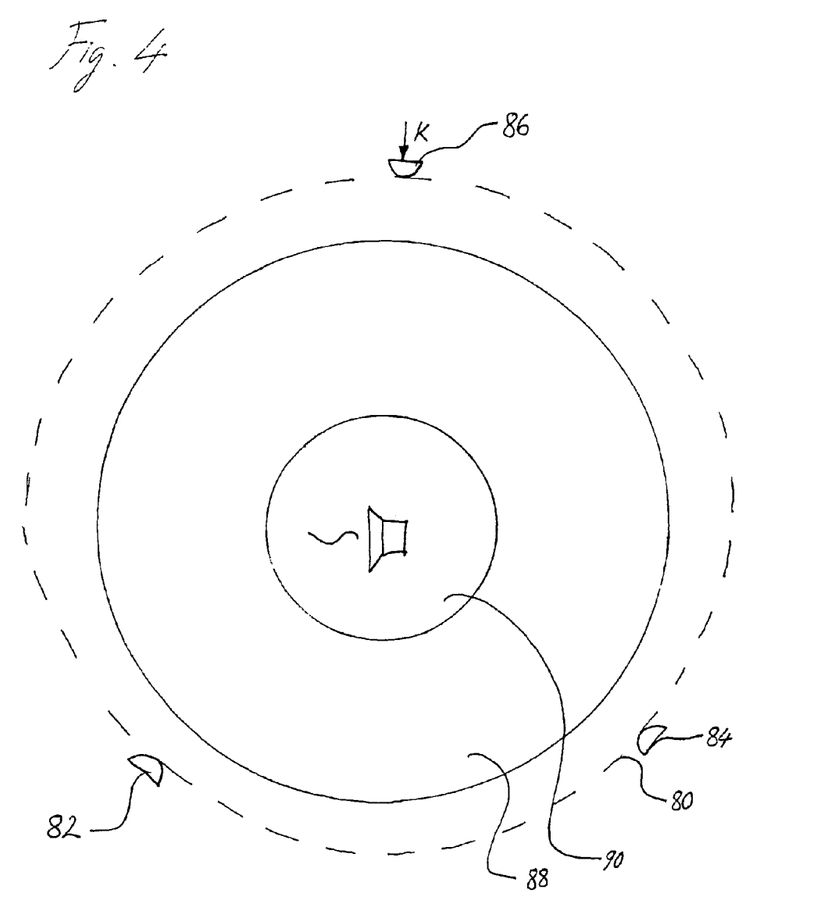
FIG. 4: a holding device in a fourth embodiment with passive and active lateral positioning elements in perspective view.

FIG. 4 shows another embodiment of the invented holding device in greatly simplified top view. A round wafer 80 is held in a lateral position therein between two stop elements 82 and 84 fixed in place in the wafer plane and an edge gripper 86 which can move back and forth between a fixation and a release. The edge gripper 86 is connected to an activating mechanism and designed to grab the wafer 80 in the edge region and apply a clamping force K acting parallel to the wafer plane. Thanks to the three-point bearing system, the position in the wafer plane is accurately defined. An entrainment by the rotatable stop elements and the edge gripper 86 occurs by means of frictional closure. Thus, the sample embodiment per FIG. 4, unlike that of FIG. 3, is a device for lateral positioning of the wafer 80 with an active edge gripper and positive-locking entrainment. The activating mechanism for the edge gripper 86, the rotational drive, and the distance holding device are located on the same side beneath the wafer 80, so that its top side is freely accessible for inspection. The activating mechanism for the edge gripper 86 and the rotational drive are not shown in FIG. 4.

The distance positioning device in this embodiment has a table 88 with sound generating means 90, beaming out levitation sound waves which hold the wafer 80 in suspension and thus at a defined distance above the table 88.

Thanks to its flexibility, the holding device of the invention can be used not just with the above-mentioned scattered light inspection device for inspecting the surface of wafers. Furthermore, it can be combined, for example, with an image recognition or scattered light inspection device for edge inspection, a device for geometrical surveying of the wafer, especially its edge geometry, or a wafer ID reader for reading out information provided on the wafer in familiar manner.

Instead of the lateral positioning device with three stop elements or edge grippers shown in the sample embodiments, a total of four or more stop elements and edge grippers can also be provided on the periphery for the positioning of the object or wafer.

LIST OF REFERENCE NUMBERS 10 table
12 nozzle
14 fluid flow
16 wafer (object)
18 gap between table and object
20 lateral positioning device
22 edge gripper
24 edge gripper
26 back and forth motion
28 bent end of edge gripper
30 bent end of edge gripper
32 housing
34 rotational drive
36 spoke segment
37 spoke segment
38 spring element
39 spring element
40 table
42 spoke star
44 stop element
46 stop element
48 stop element
50 nozzle
54 driver
60 table
61 wafer
62 spoke star
64 nozzle
66 suction nozzle
68 opening (groove)
70 stop element
72 stop element
74 stop element
76 projection (driver)
78 centrifugal weight
80 wafer
82 stop element
84 stop element
86 stop element
88 table
90 A sound generating means
A rotational axis
K clamping force

What is claimed is:

1. A holding and turning device for touch-sensitive objects comprising: a distance positioning device which is arranged for holding the object perpendicular to an object plane at a defined distance, a lateral positioning device, arranged for positioning the object in the object plane and for rotating together with the object about a rotational axis perpendicular to the object plane, and with a rotational drive, coupled with the lateral positioning device, providing a driving force for rotating the object about the rotational axis, wherein the driving force can be applied to the object by the lateral positioning device, wherein the lateral positioning device does not make contact with the object at either its top side or bottom side and the distance positioning device is adapted for holding the object without involving contact, and is decoupled from the rotational drive in such a way that the distance positioning device does not rotate together with the object.

2. The holding device per claim 1, wherein the distance positioning device has a nozzle arrangement, which is designed to create a fluid flow directed essentially perpendicular to the surfaces, which is used to support the object at a defined distance.

3. The holding device per claim 1, wherein the distance positioning device has sound generating means, which are designed to produce levitating sonic waves.

4. The holding device per claim 2, wherein the distance positioning device has evacuation means that are designed to create a local partial vacuum and that interact with the nozzle arrangement or sound generating means to hold the object at the defined distance.

5. The holding device per claim 2, wherein the distance positioning device has an essentially flat table, in which the nozzle arrangement, wherein the distance positioning device has sound generating means, or the evacuation means, or both that are arranged so that the object is held at the defined distance parallel to the table.

6. The holding device per claim 5, wherein the table has a smaller diameter than the object being held.

7. The holding device per claim 5, wherein the table has an opening for an optical measurement system to have access to the object.

8. The holding device per claim 1, wherein the lateral positioning device is designed to apply the driving force to the object by means of a frictional connection.

9. The holding device per claim 1, wherein the lateral positioning device is designed to apply the driving force to the object by means of positive locking.

10. The holding device per claim 1, wherein the lateral positioning device has at least one edge gripper which can move back and forth between a fixation and a release, being designed to grasp the object in the edge region and apply a clamping force acting parallel to the object plane.

11. The holding device per claim 10 for round circular objects, wherein the lateral positioning device has three edge grippers which can move back and forth between a fixation and a release, arranged at a spacing on a circle.

12. The holding device per claim 11, wherein the three edge grippers can move back and forth between the fixation and the release in synchronization by means of a common activating mechanism.

13. The holding device per claim 10 wherein the edge gripper has a centrifugal weight.

14. The holding device per claim 9, wherein the lateral positioning device has a driver designed to engage with a corresponding recess of the object.

15. The holding device per claim 1, wherein the lateral positioning device has at least one stop element fixed in place in the object plane, which together with an edge gripper or a driver, or both defines the position in the object plane.

16. The holding device per claim 15, wherein the stop element has a centrifugal weight.

17. The holding device per claim 1, wherein the lateral positioning device has deflection means which are designed to permit a deflection movement of the object in the distance direction.

18. The holding device per claim 17, wherein the deflection means preferably have spring elements assigned to each of a stop element, an edge gripper or driver or any combination thereof and acting in the distance direction.

19. The holding device per claim 1, wherein the lateral positioning device is designed to exert practically no holding force on the object in the distance direction.

* * * * *